(12) United States Patent
Kawai

(10) Patent No.: US 6,225,861 B1
(45) Date of Patent: May 1, 2001

(54) VARIABLE CAPACITANCE CIRCUIT

(75) Inventor: Kazuo Kawai, Tokyo (JP)

(73) Assignee: General Resaerch of Electronics, Inc., Tokyo (JP)

( * ) Notice: Subject to any disclaimer, the term of this patent is extended or adjusted under 35 U.S.C. 154(b) by 0 days.

(21) Appl. No.: 09/397,184

(22) Filed: Sep. 16, 1999

(30) Foreign Application Priority Data

Sep. 21, 1998 (JP) .................................................. 10-284800

(51) Int. Cl.[7] .................................................. H03K 17/74
(52) U.S. Cl. ............................................ 327/586; 327/308
(58) Field of Search .................................... 327/308, 337, 327/554, 586

(56) References Cited

U.S. PATENT DOCUMENTS

| | | | |
|---|---|---|---|
| 3,391,347 | * 7/1968 | Bosse et al. ........................... | 327/586 |
| 4,021,740 | * 5/1977 | Horna ................................... | 327/129 |
| 4,195,274 | * 3/1980 | Suganuma ............................ | 327/586 |
| 4,701,714 | * 10/1987 | Agoston ............................... | 327/586 |
| 5,327,017 | * 7/1994 | Fischer et al. ........................ | 327/586 |
| 5,378,937 | * 1/1995 | Heidemann et al. ................. | 327/586 |
| 5,378,939 | * 1/1995 | Marsland et al. ...................... | 327/91 |
| 5,990,761 | * 11/1999 | Hamparian et al. .................. | 327/586 |
| 6,011,432 | * 1/2000 | Fratti et al. ........................... | 327/554 |

* cited by examiner

*Primary Examiner*—Terry D. Cunningham
(74) *Attorney, Agent, or Firm*—Flynn, Thiel, Boutell & Tanis, P.C.

(57) ABSTRACT

In order to provide a variable capacitance circuit having very small voltage dependability, this circuit is constituted by two variable capacitance diodes. An input signal is applied to each of said diodes with backward polarity and a capacitance control voltage is applied to each of said diodes with the same polarity.

20 Claims, 2 Drawing Sheets

VARIABLE CAPACITANCE CIRCUIT

FIELD OF THE INVENTION

The present invention relates to an improvement of the circuit construction of a variable capacitance circuit suitable for use in an antenna input circuit of a radio receiver for reducing cross modulation and mutual modulation, a frequency modulator having low high harmonic wave distortion, or a variable phase shifter.

DESCRIPTION OF THE PRIOR ART

A continuous variable attenuator comprising PIN diodes and etc. as a conventional variable attenuator is developed. This utilizes that its input resistance varies greatly but since it is utilized therein that its input resistance varies exponentially, the inner resistance depends on a voltage or a current and is non-linear with respect to an input signal. Accordingly, an applicable amplitude of an input signal to that attenuator is limited to very small range.

So, the inventor provided a variable attenuator including a variable capacitance diode to which an input signal having more large amplitude is applicable in Japanese Patent Application No. 10-253297. Since said diode is used with backward bias polarity in this variable attenuator, applicable amplitude of the input signal to it can be made more large. However, in this case, its capacitance depends on a voltage and thus said attenuator only utilizes characteristic of said element (diode) as it is.

SUMMARY OF THE INVENTION

In view of such present situation, an object of the invention is to provide a variable capacitance circuit comprising variable capacitance diodes applicable to a variable attenuator and etc. so constructed that characteristic of the variable capacitance diode in the vicinity of an operating point can be corrected.

In order to attain the object, a first variable capacitance circuit according to the invention is characterized by employment of at least two variable capacitance diodes, means for applying an input signal to each of said diodes with backward polarity and means for applying a capacitance control voltage to each of said diodes with same polarity.

Further a second capacitance circuit according to the invention is characterized by employment of a first variable capacitance circuit comprising at least two variable capacitance diodes, a second variable capacitance circuit comprising at least two variable capacitance diodes and connected in parallel with an out of the first variable capacitance circuit, means for applying an input signal to each of the variable capacitance diodes of said first variable capacitance diode with backward polarity and means for applying a capacitance control voltage to each of the variable capacitance diodes of said first and second variable capacitance circuits with same polarity.

As previously described, a conventional variable attenuator is constructed so as to make use of characteristic of a variable capacitance diode as it is. However, dependability of capacitance on an applied input voltage can be greatly improved by using two variable capacitance diodes as attenuating elements with backward A.C. polarity because their operating points on exponential characteristics are the same with each other and an input high frequency signal is applied to them with backward polarity.

This improved situation will be explained by referring to FIGS. 1 and 2. FIG. 1 shows an example of capacitance variation characteristic of a variable capacitance diode. FIG. 2($a$) shows an example of capacitance variation characteristic of two variable diodes connected with backward A.C. polarity to which a capacitance control voltage of 2 volts is applied. In this case, since an input signal is applied to said diodes with backward polarity with each other, the capacitance variation characteristic shown in the dotted line becomes addition of two characteristics corresponding to each of said diodes as shown in the solid lines.

FIG. 2($b$) shows the capacitance variation characteristic wherein the capacitance control voltage is 6 volts.

These figures show that the composed capacitance variation characteristic of said two diodes shown in the dotted line in FIG. 2 has almost never voltage dependability. Accordingly, an input signal having large amplitude can be applied to said two variable capacitance diodes to control capacitance thereof effectively.

DESCRIPTION OF THE PREFERRED EMBODIMENTS

Embodiments of variable capacitance circuits according to the invention will be explained by referring to drawings herein below.

Figure 2A:
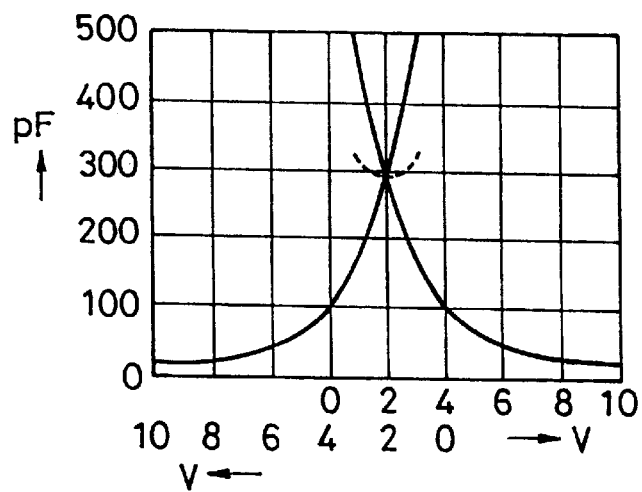
FIGS. 2($a$) and ($b$) are diagrams showing a combination of two capacitance variation characteristics to explain operation principle of the invention.
Figure 2B:
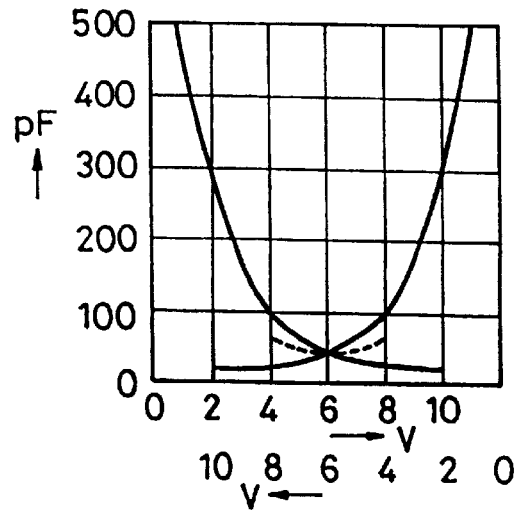
Figure 3:
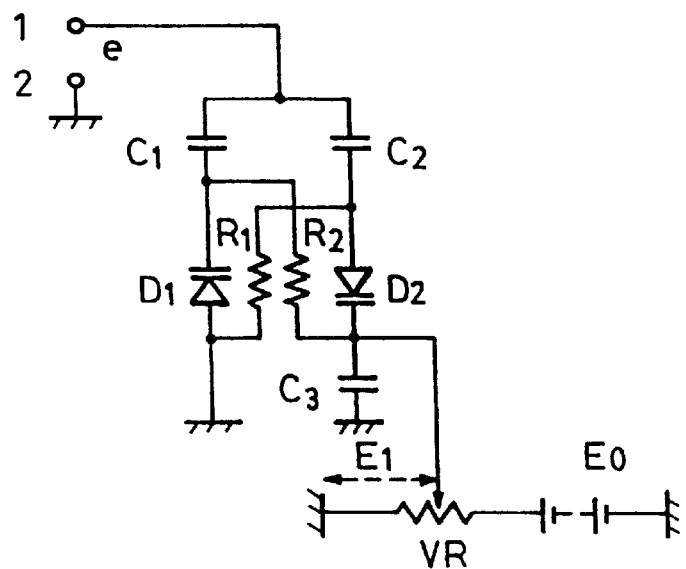
FIG. 3 is a circuit diagram to explain basic construction of the invention.

FIG. 3 shows an embodiment of a variable capacitance circuit according to the invention. In the same figure, 1 and 2 are input terminals for an input signal e, D1 and D2 are variable capacitance diodes. VR is a potentiometer, E0 is a d.c. supply, C1 to C3 are condensers, R1 and R2 are resistors, and E1 is a capacitance control voltage to control capacitance of said diodes. In this circuit construction, since the capacitance control voltage E1 having the same polarity is applied to the diodes D1 and D2, the both diodes D1 and D2 operate on the basis of the same operation point. An input signal (an A.C. voltage) from the input terminals 1, 2 is applied to the both diodes D1, D2 with backward polarity with each other, so that a positive half cycle signal in this input signal causes the capacitance of said variable capacitance diode D1 to reduce less than the capacitance corresponding to the voltage E1 and causes the capacitance of said variable capacitance diode D2 to increase and a negative half cycle signal therein causes the reverse result to this. Thus, both diodes D1 and D2 operate to provide addition both capacitances with respect to the applied input signal. This operation is shown in FIG. 2.

Values of resistors R1 and R2 and capacitances C1 to C3 are so selected as not to influence operation of said variable capacitance diodes D1, D2. Also, inductors may be used in spite of said resistors R1, R2. In this way, according to this embodiment, voltage dependability of the variable capacitance diode can be improved greatly.

Figure 1:
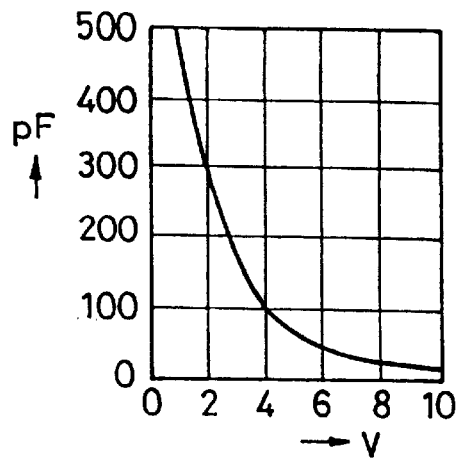
FIG. 1 is a diagram showing an example of capacitance variation characteristic of a variable capacitance diode used in the invention.
Figure 4:
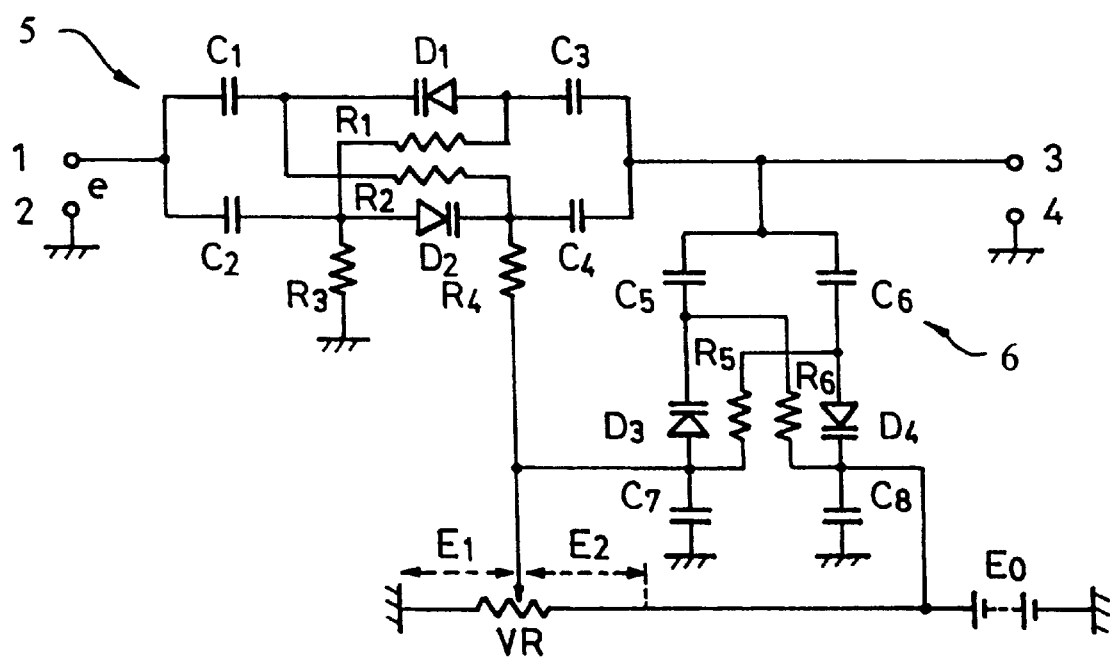
FIG. 4 is a circuit diagram showing an embodiment of the invention.

FIG. 4 shows a circuit of an embodiment of the invention constituting a variable attenuator of capacitance dividing type by using the variable capacitance circuit of FIG. 3. In FIG. 4, 1 and 2 are input signal terminals, 3 and 4 are output signal terminals, 5 and 6 are first and second variable capacitance circuits. Further, D1 to D4 are variable capacitance diodes, C1 to C8 are capacitors, R1 to R6 are resistors. E1 and E2 are the capacitance control voltages for the respective variable capacitance circuits 5 and 6, respectively. E0 is a D.C. supply, VR is a potentiometer.

Diodes D1 and D2, capacitors C1 –C4 and resistors R1–R3 form the first variable capacitance circuit 5. Diodes D1 and D2, relative to each other, have reverse polarities. Resistor R1 extends between the anode of diode D1 and the anode of diode D2. Resistor R2 extends between the cathode of diode D1 and the cathode of diode D2. Resistor R3 extends between the anode of diode D2 and ground. The signal from input terminal 1 is applied to the cathode of diode D1 through capacitor C1. The anode of diode D1 is connected to capacitor C3. The signal from input terminal 1 is applied to the anode of diode D2 through capacitor C2. Capacitor C4 is tied to the cathode of diode D2. The ends of capacitors C3 and C4 distal from diodes D1 and D2, respectively, are tied together.

Diodes D3 and D4, capacitors C5–C8 and resistors R5 and R6 form the second variable capacitance circuit 6. Capacitors C5 and C6 are connected at one end to each other and, at that end, to the junction of capacitors C3 and C4. Diodes D3 and D4, relative to each other, have reverse polarities. Resistor R5 extends between the anode of diode D3 and the anode of diode D4. Resistor R6 extends between the cathode of diode D3 and the cathode of diode D4. The end of capacitor C5 distal from the C3–C6 capacitor junction is connected to the cathode of diode D3. The end of capacitor C6 distal from the C3–C6 capacitor junction is connected to the anode of diode D4. Capacitor C7 extends between the anode of diode D3 and ground. Capacitor C8 extends between the cathode of diode D4 and ground. Output terminal 3 is connected to the C3–C6 capacitor junction. Input terminal 2 and output terminal 4 are tied to ground.

It will be observed that, in the signal path between terminals 1 and 3, diodes D2 and D3 are both forward biased; diodes D1 and D4 are reverse biased.

Potentiometer VR is tied between the DC power supply E0 and ground. The wiper of the potentiometer VR is tied to the anode of diode D3. The E2 capacitance control voltage, the voltage present between the power supply E0 and the wiper of potentiometer VR, is applied to the cathode of diode D4. The E2 capacitance control voltage is also applied through resistor R6 to the cathode of diode D3. The wiper of potentiometer VR is also tied to one end of resistor R4. The opposite end of resistor R4 is tied to the junction of diode D2, resistor R2 and capacitor C4. Thus, the voltage between the wiper of potentiometer VR and ground, the E1 capacitance control voltage, is applied to the cathode of diode D2 through resistor R4. The E1 capacitance control voltage is applied to the cathode of diode D1 through resistors R4 and R2.

In this circuit construction, since E1 and E2 are caused to vary differentially, by operating the potentiometer VR, dividing ratio of composite capacitance of the variable capacitance diodes D1, D2 and composite capacitance of the variable capacitance diodes D3, D4 can be varied and the circuit of FIG. 4 operates as a variable attenuator. Since this circuit has high input impedance, it is necessary to use an impedance converter to connect it to a low input impedance circuit.

As explained in detail, a variable attenuator, a variable phase shifter and a frequency modulator, etc. having low distortion can be constituted by using a variable capacitance circuit according to the invention.

What is claimed is:

1. A variable capacitance circuit assembly comprising:
    a first variable capacitance circuit including: first and second variable capacitance diodes, said first and second variable capacitance diodes having reverse polarities relative to each other; and an output connected to said first and second variable capacitance diodes;
    a second variable capacitance circuit including third and fourth variable capacitance diodes, said third and fourth variable capacitance diodes having reverese polarities relative to each other and being connected in parallel with the output of said first variable capacitance circuit;
    means for appling an input signal to the first and second variable capacitance diodes of the first variable capacitance circuit at ends of the first and second variable capacitance diodes opposite the ends connected to the output;
    means for producing a first capacitance control voltage and a means for producing a second capacitance control voltage;
    means for adjusting the first and second capacitance control voltages so that the capacitance control voltages vary differentially with each other; and
    means for applying the first capacitance control voltage to said first variable capacitance circuit and for applying the second capacitance control voltage to said second variable capacitance circuit wherein the variable capacitance diodes to which the capacitance control voltages are applied have the same polarity.

2. The variable capacitance circuit assemble of claim 1, furhter including:
    a first resistor connected between an anode of said first variable capacitance diode and an anode of said second variable capacitance diode; and
    a second resistor connected between a cathode of said first variable capacitance diode and a cathode of said second variable capacitance diode.

3. The variable capacitance circuit assembly of claim 1 wherein:
    said means for producing the first capacitance control voltage and the second capacitance control voltage is a single power supply; and
    said means for adjusting the first and second capacitance control voltages is a potentiometer that is tied between said power supply and ground, said potentiometer having a wiper, wherein a voltage present across said potentiometer from a first side of said wiper is applied to said first variable capacitance circuit as the first capacitance control voltage and a voltage present across said potentiometer from a second side of said wiper is applied to said second variable capacitance circuit as the second capacitance control voltage.

4. The variable capacitance circuit assembly of claim 1, further including: a first capacitor located between said means for applying the input signal and said first variable capacitance diode; and a second capacitor located between said means for applying the input signal and said second variable capacitance diode.

5. The variable capacitance circuit assembly of claim 4, further including: a third capacitor located between said first variable capacitance diode and the output of said first variable capacitance circuit; and a fourth variable capacitance diode located between said second variable capacitance diode and the output of said first variable capacitance circuit.

6. The variable capacitance circuit assembly of claim 5, further including: a fifth capacitor located between the output said first variable capacitance circuit and said third variable capacitance diode; and a sixth capacitor located between the output of said first variable capacitance circuit and said fourth variable capacitance diode.

7. The variable capacitance circuit assembly of claim 1, wherein said second variable capacitance circuit is tied between the output of said first variable capacitance circuit and ground and an output terminal for said assembly is connected to the output of said first variable capacitance circuit.

8. A variable capacitance assembly including:
- a first variable capacitance circuit comprising: an input terminal; first and second variable capacitance diodes, each said diode having opposed ends, wherein one end of each said first and second variable capacitance diode is connected to said input terminal and said first and second variable capacitance diodes are arranged so as to have reverse polarities relative to each other; and an output terminal, wherein the ends of said first and second variable capacitance diodes opposite the ends connected to said input terminal are connected to said output terminal;
- a second variable capacitance circuit connected between said output terminal of said first variable capacitance circuit and ground, said second variable capacitance circuit including third and fourth variable capacitance diodes, wherein said third and fourth variable capacitance diodes each has opposed ends and one end connected to said output terminal of said first variable capacitance circuit and said third and fourth variable capacitance diodes are arranged to have reverse polarities relative to each other;
- a power supply for supplying a first capacitance control voltage;
- a power supply for supplying a second capacitance control voltage;
- a regulator connected to said power supply for supplying the first capacitance control voltage and to said power supply for supplying the second capacitance control voltage, said regulator adjusting the first and second capacitance control voltages so that the capacitance control voltages vary differentially with each other; and
- a supply network for supplying the first capacitance control voltage to said first variable capacitance control circuit and for supplying the second capacitance control network to said second variable capacitance control network, said supply network being configured so that said first capacitance control voltage and said second capacitance control voltage are applied to said capacitance control diodes having the same polarity.

9. The variable capacitance assembly of claim 8, wherein:
said power supply for supplying the first capacitance control voltage and said power supply for supplying the second capacitance control voltage are a single, unitary power supply; and
said regulator is connected to said unitary power supply for supplying the first and second capacitance control voltages to said supply network.

10. The variable capacitance assembly of claim 9, wherein: said regulator is a potentiometer having a wiper; said potentiometer is connected between said unitary power supply and ground; said supply network applies the voltage present between the wiper and ground to said first variable capacitance circuit as the first capacitance control voltage; and said supply network applies the voltage present between the wiper and said unitary power supply to said second variable capacitance circuit as the second capacitance control circuit.

11. The variable capacitance assembly of claim 8, further including:
- a first capacitor located between said input terminal of said first variable capacitance control circuit and said first variable capacitance diode; and
- a second capacitor located between said input terminal of said first variable capacitance control circuit and said second variable capacitance diode.

12. The variable capacitance assembly of claim 11, further including:
- a third capacitor located between said first variable capacitance diode and said output terminal of said first variable capacitance control circuit; and
- a fourth capacitor located between said second variable capacitance diode and said output terminal of said first variable capacitance control circuit.

13. The variable capacitance assembly of claim 11, further including:
- a third capacitor located between said output terminal of said first variable capacitance control circuit and said third variable capacitance diode; and
- a fourth capacitor located between said output terminal of said first variable capacitance control circuit and said fourth variable capacitance diode.

14. The variable capacitance assembly of claim 8, further including:
- a first capacitor located between said output terminal of said first variable capacitance control circuit and said third variable capacitance diode; and
- a second capacitor located between said output terminal of said first variable capacitance control circuit and said fourth variable capacitance diode.

15. The variable capacitance assembly of claim 14, further including:
- a third capacitor located between said third variable capacitance diode and ground; and
- a fourth capacitor located between said fourth variable capacitance diode and ground.

16. The variable capacitance assembly of claim 8, further including:
- a first resistor connected between an anode of said first variable capacitance diode and an anode of said second variable capacitance diode; and
- a second resistor connected between a cathode of said first variable capacitance diode and a cathode of said second variable capacitance diode.

17. The variable capacitance assembly of claim 16, further including:
- a third resistor connected between an anode of said third variable capacitance diode and an anode of said fourth variable capacitance diode; and
- a fourth resistor connected between a cathode of said third variable capacitance diode and a cathode of said third variable capacitance diode.

18. The variable capacitance assembly of claim 17, further including:
- a first capacitor located between said input terminal of said first variable capacitance control circuit and said first variable capacitance diode;
- a second capacitor located between said input terminal of said first variable capacitance control circuit and said second variable capacitance diode;

a third capacitor located between said first variable capacitance diode and said output terminal of said first variable capacitance control circuit;

a fourth capacitor located between said second variable capacitance diode and said output terminal of said first variable capacitance control circuit a fifth capacitor located between said output terminal of said first variable capacitance control circuit and said third variable capacitance diode; and a sixth capacitor located between said output terminal of said first variable capacitance control circuit and said fourth variable capacitance diode.

19. The variable capacitance assembly of claim 17, wherein:

said power supply for supplying the first capacitance control voltage and said power supply for supplying the second capacitance control voltage are single, unitary power supply; and said regulator is a potentiometer having a wiper and said potentiometer is connected between said unitary power supply and ground; and said supply network applies the voltage present between the wiper and ground to a junction of the cathode of said second variable capacitance diode and said second resistor as the first capacitance control voltage; and said supply network applies the voltage between the wiper and said unitary power supply to a junction of said fourth variable capacitance diode and said fourth resistor as the second capacitance control voltage.

20. The variable capacitance assembly of claim 19, further including a fifth resistor disposed in said supply network wherein said fifth resistor is positioned so that the first capacitance control voltage is applied to the junction of the cathode of said second variable capacitance diode and said second resistor through said fifth resistor.

* * * * *